(12) United States Patent  
Pauser

(10) Patent No.: US 6,667,882 B2
(45) Date of Patent: Dec. 23, 2003

(54) COOLING ASSEMBLY FOR A HEAT PRODUCING ASSEMBLY

(75) Inventor: Donald George Pauser, Roseville, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/144,785

(22) Filed: May 15, 2002

(65) Prior Publication Data

US 2003/0214784 A1 Nov. 20, 2003

(51) Int. Cl.$^7$ ................................................. H05K 7/20
(52) U.S. Cl. .................. 361/695; 29/890.03; 165/80.3; 257/719; 361/719
(58) Field of Search ................................ 248/505, 510; 454/184; 257/718, 719, 726, 727; 312/236; 165/80.3, 104.33, 121–126; 174/16.3, 252; 29/890.03, 832, 840; 361/687, 695, 697, 704, 705, 709–712, 717–719, 720

(56) References Cited

U.S. PATENT DOCUMENTS

| | | | | | |
|---|---|---|---|---|---|
| 5,630,469 | A | * | 5/1997 | Butterbaugh et al. | 165/80.3 |
| 5,841,633 | A | * | 11/1998 | Huang | |
| 5,854,738 | A | * | 12/1998 | Bowler | 361/695 |
| 6,259,375 | B1 | * | 7/2001 | Andras | 340/907 |
| 6,269,001 | B1 | * | 7/2001 | Matteson et al. | 361/695 |
| 6,414,848 | B1 | * | 7/2002 | Chen | 361/704 |
| 6,435,889 | B1 | * | 8/2002 | Vinson et al. | 439/247 |
| 6,477,051 | B1 | * | 11/2002 | Barsun | 361/704 |
| 6,529,375 | B2 | * | 3/2003 | Miyahara et al. | 361/697 |

* cited by examiner

*Primary Examiner*—Gerald Tolin

(57) ABSTRACT

A cooling assembly for dissipating heat produced in a heat generating component of an electronic system includes a shroud assembly. The cooling assembly also includes a heat dissipating device removably housed within the shroud assembly and a fan assembly removably housed within the shroud assembly. The shroud assembly further includes a plurality of mounting assemblies slidably attached to the shroud assembly and configured to removably secure the cooling assembly in thermal connection to the heat generating component.

20 Claims, 9 Drawing Sheets

COOLING ASSEMBLY FOR A HEAT PRODUCING ASSEMBLY

FIELD OF THE INVENTION

This invention relates generally to electronic devices. More particularly, the invention pertains to an assembly for cooling a heat generating component in an electronic device.

BACKGROUND OF THE INVENTION

The components (e.g., processors, micro-controllers, high speed video cards, disk drives, semi-conductor devices, etc.) of an electronic system are generally known to generate rather significant amounts of heat. It has been found that the performance and reliability of the components typically deteriorate (e.g., crash or lock up the entire computer system) as the to temperature of the components increase. Additionally, the program being run by the processor may contain errors and memory errors may also exist with increased component temperatures. Electronic systems are thus typically equipped with a mechanism (e.g., a fan) attached to a housing of the electronic system to cool the components. Although these types of mechanisms have been relatively effective in cooling the components of certain types of electronic systems, they have been found to be relatively insufficient to cool the faster and more powerful components of today's electronic systems.

With the advent of more powerful processors which generate greater amounts of heat, the possibility that the components of electronic systems will overheat has drastically increased. One solution to the overheating problem has been to directly cool the components themselves by placing a heat pipe in thermal connection to the components. In addition, fans have been integrally attached to the heat pipe to blow heated air away from the heat pipe to reduce the temperature of the heat pipe and thus the temperature of the heat generating component.

Conventional heat pipes, however, often suffer from a variety of drawbacks and disadvantages. For instance, it is generally known to attach heat pipes to heat generating components with adhesive. Although the use of adhesive affords a relatively secure connection between the heat pipe and the component and does not require a relatively large amount of space around the component, one associated with its use is the difficulty involved with removal of the heat pipe from the component. For example, attempts to remove the heat pipe from the component may result in damage of either or both the heat pipe and the component. Thus, in certain instances, e.g., when it is undesirable to replace both the heat pipe and the heat generating component, it has been found to be disadvantageous to attach a heat pipe to a component with adhesive.

It is also generally known to position heat pipes in contact with components by employing mechanical fasteners. The mechanical fasteners typically require a tool for insertion or removal thereof (e.g., clippings, screws, etc.). These assemblies typically possess a plurality of mechanical fasteners that attach to mating sections of a substrate (e.g., a motherboard). One problem associated with these types of assemblies is that a relatively large amount of space around a heat generating component and a heat pipe may be required to provide adequate access to install and remove the mechanical fasteners. Additionally, a tool (e.g., a screwdriver or the like) may typically be required for installation and removal of the heat pipe.

Further disadvantages are associated with the fact that fans are typically integrally attached to the heat pipes in conventional heat pipes. That is, in known heat pipes, it may be relatively difficult to detach a fan from a heat pipe. For instance, conventional heat pipe and fan assemblies are typically constructed as integral assemblies. Thus, the fans may not be detached from the heat pipe without causing some type of damage to either the fan or the heat pipe. Additionally, a tool (e.g., screwdriver or the like) may be required to detach the fan from the heat pipe.

SUMMARY OF THE INVENTION

In accordance with an embodiment of the present invention, a cooling assembly for dissipating heat produced in a heat generating component of an electronic system is provided. The cooling assembly includes a shroud assembly, a heat dissipating device removably housed within the shroud assembly, a fan assembly removably housed within the shroud assembly, and a plurality of mounting assemblies slidably attached to the shroud assembly and configured to removably secure the cooling assembly in thermal connection to the heat generating component.

According to another embodiment, the present invention pertains to a system for cooling a heat generating component. The cooling system includes a cooling means for cooling the heat generating component and a connecting means for detachably connecting the cooling means to a substrate supporting the heat generating component.

According to yet another embodiment, the present invention pertains to a method for cooling a heat generating component of an electronic system. According to the method, a heat dissipating device is inserted within a first section of a shroud assembly. The heat dissipating device is supported within the first section of the shroud assembly with a bottom frame of the shroud assembly. A fan assembly is inserted into a second section of the shroud assembly and the shroud assembly is positioned over the heat generating component such that a bottom surface of the heat dissipating device is positioned substantially directly over the heat generating component. The shroud assembly is fastened over the heat generating component by a plurality of latches which are maneuvered onto a plurality of hooks positioned adjacent to the heat generating component.

BRIEF DESCRIPTION OF THE DRAWINGS

Features and advantages of the present invention will become apparent to those skilled in the art from the following description with reference to the figures, in which.

DETAILED DESCRIPTION OF THE INVENTION

For simplicity and illustrative purposes, the principles of the present invention are described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Figure 1A:
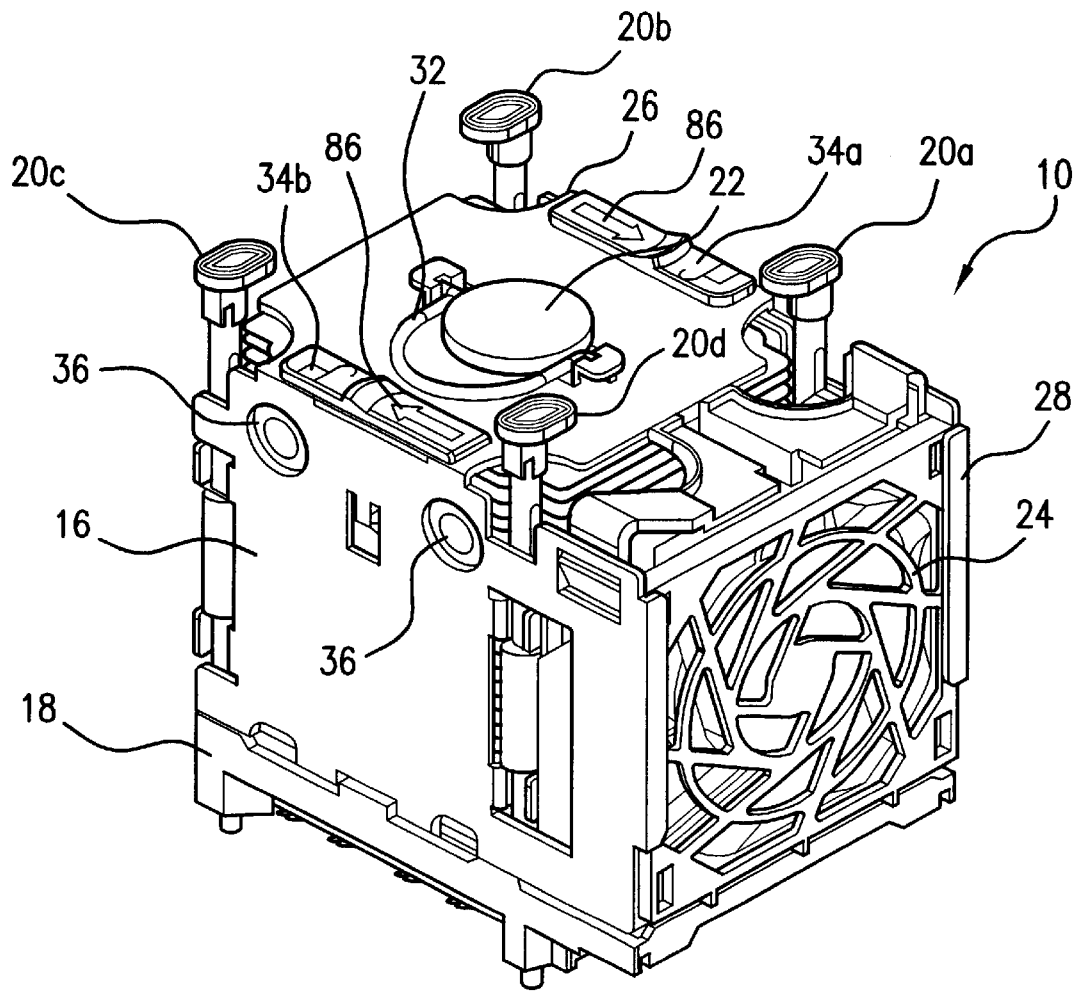
FIG. 1A illustrates an exploded perspective view of a cooling assembly in accordance with an embodiment of the present invention.

With reference first to FIG. 1A, there is illustrated a cooling assembly 10 generally configured to dissipate heat produced by a heat generating component 12 of an electronic system (not shown). Although the heat generating component 12 is depicted as a processor chip, it is to be understood that the invention is not limited to an assembly for cooling processors, but rather, the cooling assembly of the present invention may be configured to cool any reasonably suitable heat generating component in an electronic system. Suitable electronic systems may include, for example, computer systems, video systems, audio systems, etc.

As will become better understood from a reading of the following description, most of the components of the cooling assembly 10 are configured to be attached together without requiring hardware or tools. In addition, the cooling assembly 10 is configured for placement over the heat generating component 12 without requiring the use of tools, adhesives, hardware, and the like. Consequently, the cooling assembly 10 may be assembled and disassembled with relative ease and the cooling assembly 10 may be securely positioned over a heat generating component 12 also with relative ease.

With further reference to FIG. 1A, there is shown a perspective exploded view of a cooling assembly 10 for cooling a heat generating component 12 attached to a substrate 14 (e.g., printed circuit board) of an electronic system (not shown). The cooling assembly 10 includes a shroud assembly 16, a shroud bottom frame 18, and a plurality of mounting shaft assemblies 20a–20d. A bail handle 32 is connected to an upper portion of the shroud assembly 16 to generally facilitate removal of the cooling assembly 10. Also illustrated in FIG. 1A are a pair of slide knobs 34a and 34b and a pair of wedge guide pins 36 on both sides of the shroud assembly 16.

In addition, the shroud assembly 16 houses a removable heat dissipating device 22 and a removable fan assembly 24. The heat dissipating device 22 may be any suitable heat dissipating device, such as, a heat pipe, a heat sink and the like. A suitable heat dissipating device is a heat pipe manufactured by THERMACORE, Inc., of Lancaster, Pa.

The shroud assembly 16 includes a first section 26 for removably housing the heat dissipating device 22 and a second section 28 for removably housing the fan assembly 24. Exemplary manners in which the heat dissipating device 22 and the fan assembly 24 may be inserted into the shroud assembly are described in greater detail below.

The cooling assembly 10 may be attached to the substrate 14 to enable the heat dissipating device 22 to receive and dissipate heat from the component 12. In this respect, a plurality of catch members 30a–30d are attached to the substrate 14 in any reasonably suitable manner, e.g., with adhesive, threaded fasteners, or the like. Each of the catch members 30a–30d includes a generally rounded top 72 and a notch 74 having a substantially horizontally extending upper portion 76. The catch members 30a–30d may be manufactured from sheet material into two separate members as shown in FIG. 1A. It is, however, within the purview of the present invention that each of the catch members 30a–30d may be manufactured as separate elements, each of which may be independently attached to the substrate 14. The catch members 30a–30d may be fabricated from any reasonably suitable material that may be formed to include a notch and is of sufficient strength to adequately maintain the cooling assembly 10 in a substantially rigid position with respect to the heat generating component 12.

Figure 1A:
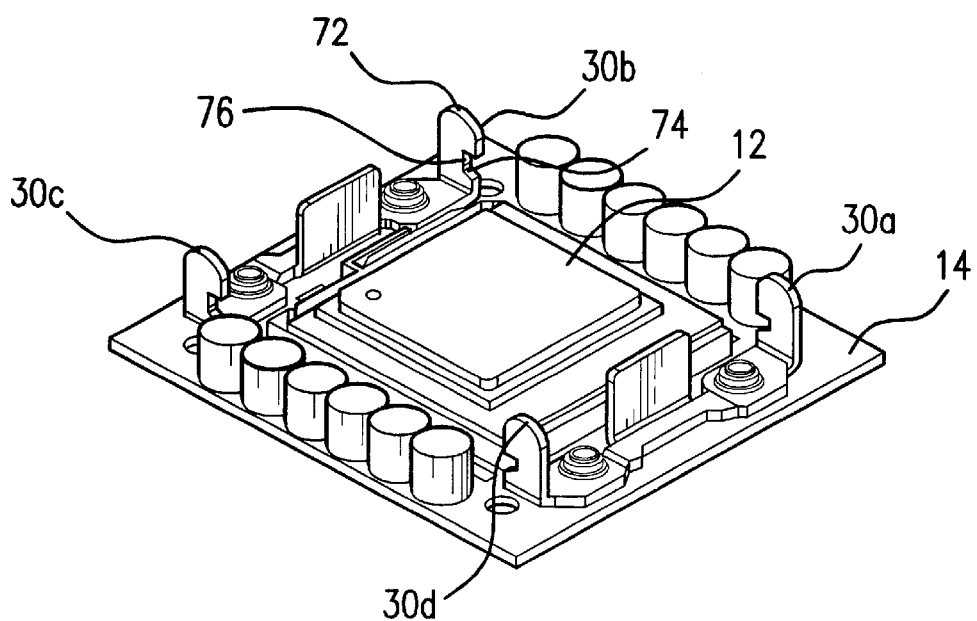
Figure 1B:
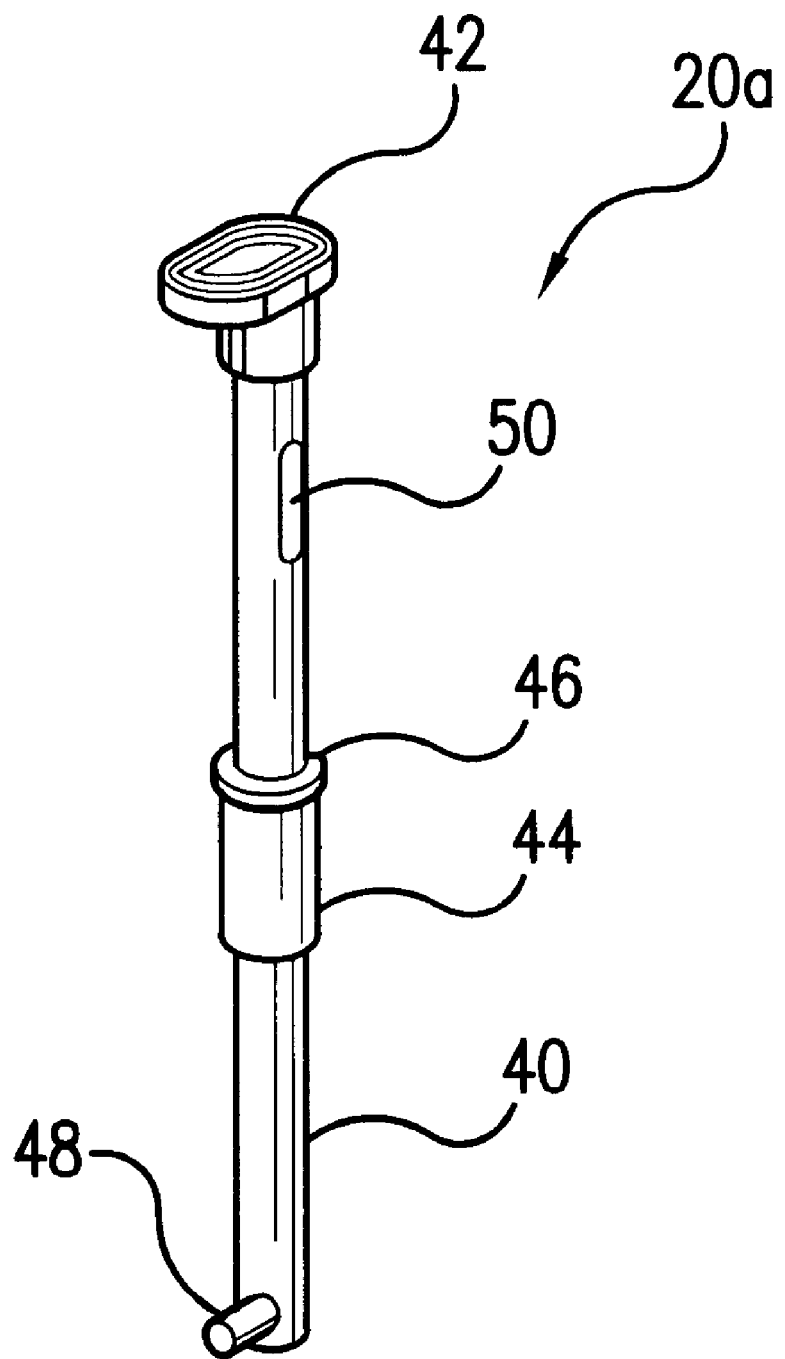
FIG. 1B is an enlarged perspective view of an exemplary mounting shaft assembly in accordance with an embodiment of the invention.

Referring now to FIG. 1B, there is illustrated an enlarged perspective view of an exemplary mounting shaft assembly 20a in accordance with an embodiment of the invention. The mounting shaft assembly 20a is generally composed of an elongate rod 40, a pad 42, a spring 44 maintained in position along the rod 40 by a retainer 46, and a pin 48. A slot 50 is formed along the extension of the rod 40 to receive a wedge (80, FIG. 3A) configured to lock the shaft assembly 20a in place when attached to the catch member 30a. The pad 42 is configured to be attached to an end of the rod 40 without mechanical fasteners in any reasonably suitable manner generally known to those skilled in the art. It should be understood that the illustration and description of the shaft assembly 20a is generally applicable to the other shaft assemblies 20b–20d. It should also be understood that some of the components of the mounting shaft assemblies 20–20d may be connected following insertion of the rods 40 into the shroud assembly 16.

According to an exemplary embodiment, the components of the mounting shaft assemblies 20a–20d may be connected together without the use of hardware or tools. For example, the pad 42 may be configured to snap-fit onto an end of the rod 40. In addition, the pin 48 may be integrally formed with the rod 40 or it may also be press-fitted to the rod 40. However it should be understood that tools may be implemented to assist in the connection of some of the components.

Figure 2:
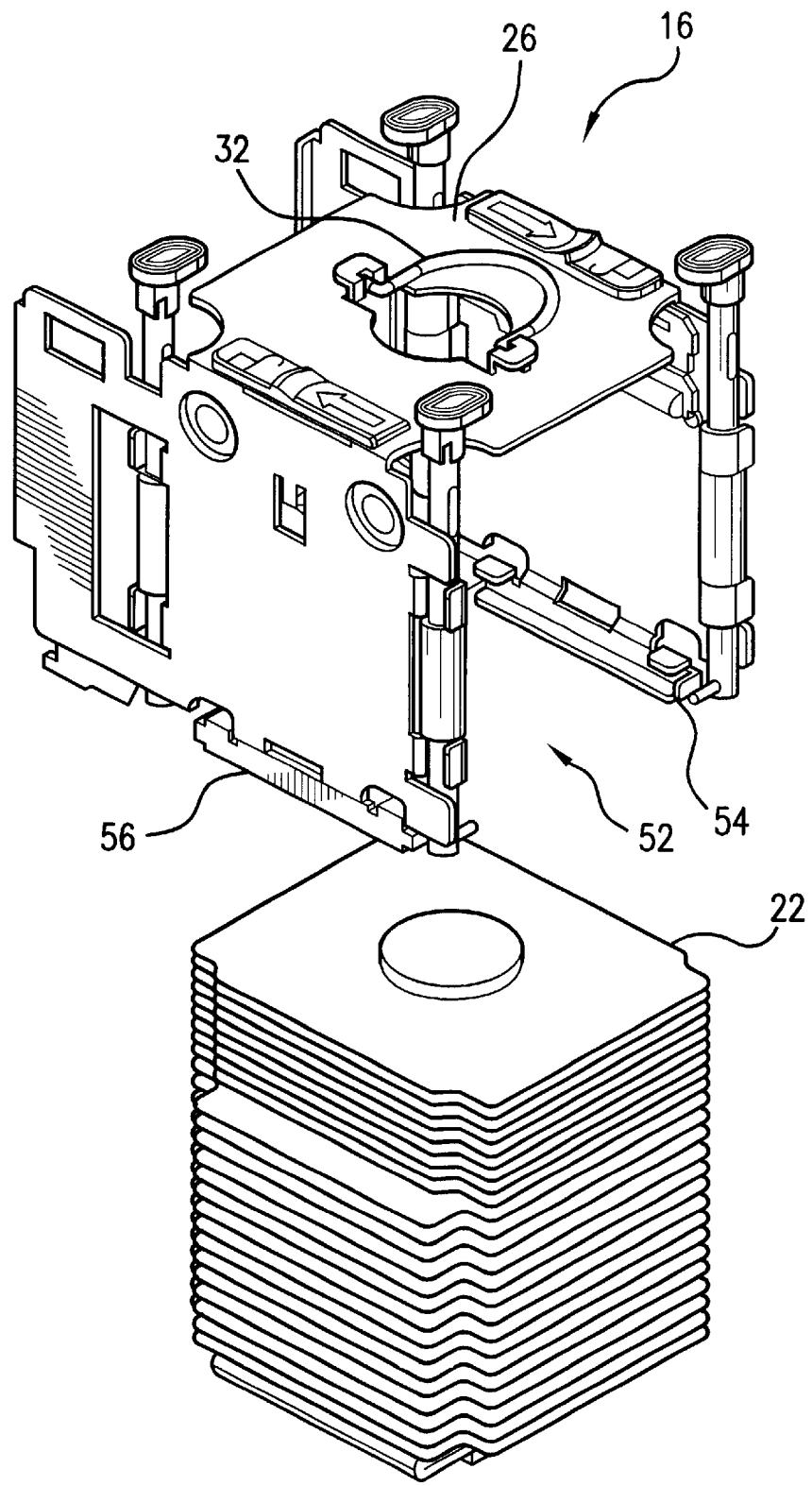
FIG. 2 illustrates a perspective view of a shroud assembly forming part of the cooling assembly shown in FIG. 1 along with a heat dissipating device, in which the shroud assembly and the heat dissipating device are rotated 180 degrees from the illustration in FIG. 1.

As illustrated in FIG. 2, the heat dissipating device 22 is inserted into the first section 26 of the shroud assembly 16 by inserting the heat dissipating device 22 from a bottom opening 52 of the shroud assembly 16. More specifically, the shroud assembly 16 may be pulled apart along the bottom edges 54, 56 thereof to thereby make the bottom opening 52 sufficiently large to enable the heat dissipating device 22 to be inserted into the first section 26. Once the heat dissipating device 22 is inserted within the shroud assembly 16, the bottom edges 54, 56 generally snap back into place to maintain the heat dissipating device 22 in position. The bail handle 32 may be employed to facilitate this maneuver. In this respect, the heat dissipating device 22 may be inserted into the shroud assembly 16 without the use of tools or hardware.

Figure 3A:
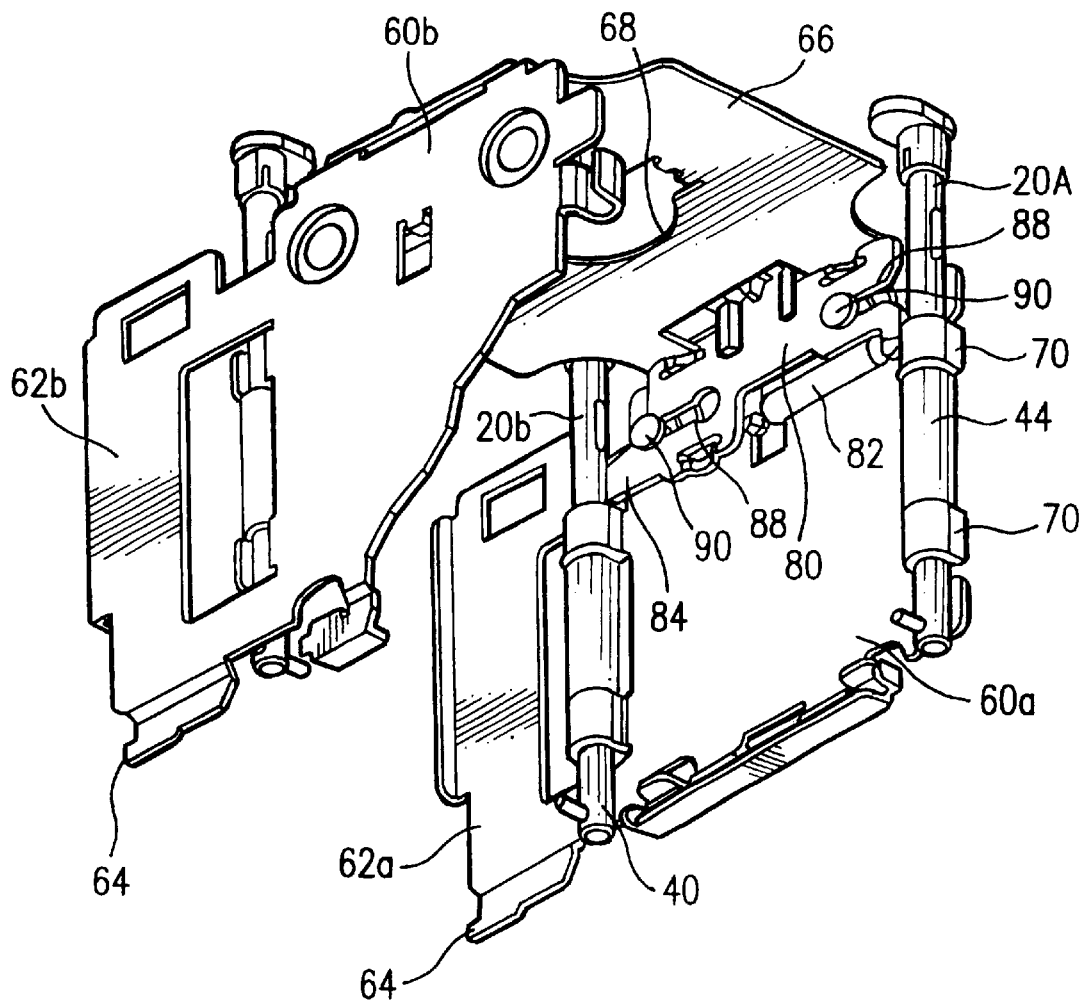
FIG. 3A is bottom perspective view, in partial section, of the shroud assembly shown in FIG. 2 and illustrates a spring loaded wedge in an unlocked position.

With reference to FIG. 3A, there is shown a perspective bottom view of the shroud assembly 16 in greater detail. In furtherance of advantages and objects of the invention, the shroud assembly 16 generally includes a pair of side walls 60a and 60b, each of which includes a respective laterally extending portion 62a and 62b. A frame hinge point 64 is provided beneath each of the laterally extending portions 62a and 62b. The side walls 60a and 60b are attached at respective top ends thereof by a top wall 66 while a space above each of the laterally extending portions 62a and 62b is relatively open.

The top wall 66 includes an opening 68 extending through the top wall to allow a top portion of the heat dissipating device 22 to extend therethrough.

According to an embodiment, the shroud assembly 16 may be fabricated from a single sheet of material. In this respect, the shroud assembly 16 may be stamped from a sheet of material and bent into a generally U-shaped configuration. Thus, the shroud assembly 16 may be manufactured from any material which may suitably and securely support the components of the cooling assembly 10 and which may withstand the heat generated by a heat generating component 12. Alternatively, the shroud assembly 16 may be manufactured from a variety of sections and joined together in a suitable manner.

With further reference to FIG. 3A, the side walls 60a and 60b include a plurality of mounting shaft supports 70 for supporting the mounting shafts 20a–20d. In cross-section, each of the supports 70 is shaped in a generally U-shaped configuration and has a width that is slightly larger than a diameter of the mounting shafts 20a–20d. In addition, each of the supports 70 includes a gap along an axial length thereof into which the spring 44 may be positioned. In this respect, the mounting shafts 20a–20d may move both vertically and rotationally with respect to the supports 70 but are generally maintained in a predetermined vertical position with respect to the shroud assembly 16 and generally return to that predetermined position when the mounting shafts are displaced by operation of the springs 44.

The mounting shafts 20a–20d are attached to the springs 44 in such a manner as to allow the mounting shafts 20a–20d to be rotated to at least a predetermined extent without facing 25 substantial interference from the springs 44. The pad 42 and the pin 48 are attached to the rod 40 such that rotation of the pad 42 causes the pin 48 to rotate in a similar manner. In general, each of the springs 44 biases a respective mounting shaft 20a–20d to substantially maintain a pin 48 in a position relatively higher than the substantially horizontal section 76 (FIG. 1A) of a catch member 30a–30d when the cooling assembly 10 is relatively properly positioned over a heat producing component 12. Thus, in use, a downward force may be applied to each pad 42 to maneuver a respective pin 48 to a height at least slightly below the substantially horizontal section 76. Each pad 42 may then be rotated to thus insert each respective pin 48 into each respective notch 74.

Each of the spring loaded mounting shafts 20a–20d may include a ¼ turn shaft. In other words, the spring loaded mounting shafts 20a–20d may only require a ¼ of a turn for the pin 48 to substantially fully engage into and disengage from the notch 74 of a respective catch member 30a–30d.

In one regard, the amount of pressure the cooling assembly 10 applies on the heat generating component 12 may be modified by changing the amount of force each spring 44 applies on each of the mounting shafts 20a–20d. In this respect, the cooling assembly 10 may be designed to prevent the application of too much or an inadequate amount of pressure on the heat generating component 12. Additionally, with further reference to FIG. 3A, each of the pads 42 of the mounting shafts 20a–20d is positioned on a top side of the cooling assembly 10. By this configuration, each of the pads 42 are relatively easily accessible without requiring access to the substrate 14 level.

The shroud assembly 10 may also include a pair of wedges 80 located adjacent to each wall 60a and 60b. The wedges 80 are configured for connection with the slide knobs 34a and 34b and contain a pair of wedge slots 88. Thus, the wedges 80 may be manipulated through movement of the slide knobs 34a and 34b. The wedge slots 88 are designed to receive respective protrusions 90 for maintaining the position of the wedges 80 as well as for enabling the wedges 80 to slide along a predetermined plane. The wedges 80 are generally biased in opposite directions with respect to each other via operation of wedge springs 82. The wedge 80 visible in FIG. 3A is thus biased in a direction generally toward the mounting shaft assembly 20b, abutting the rod 40. In addition, the wedges 80 include ends 84 having generally sloping upper sections. Although not visible in FIG. 3A, the wedge 30 located adjacent to the side wall 60b is configured to abut the rod 40 of the mounting shaft 20d.

Figure 3B:
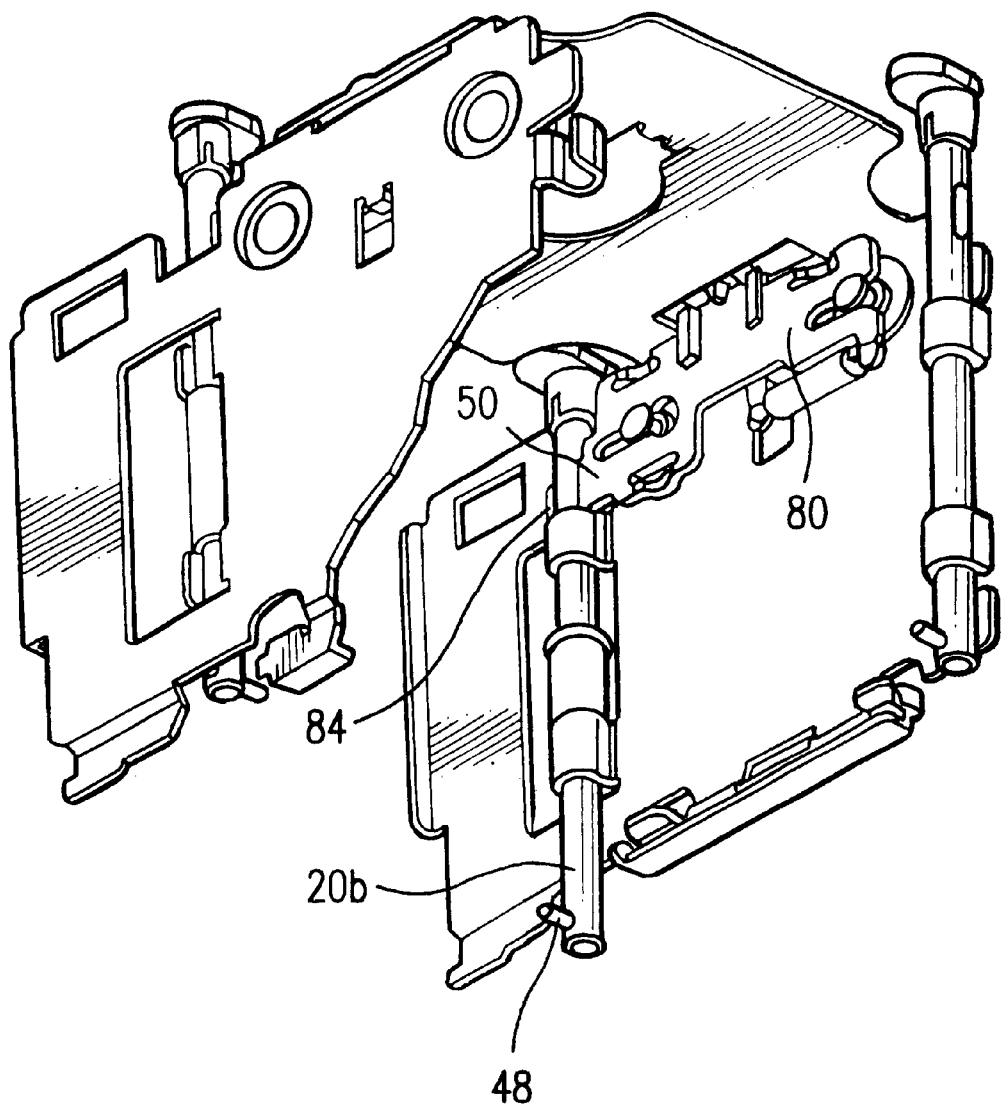
FIG. 3B is a view similar to FIG. 3A and illustrates the spring loaded wedge in a locked position.

Referring now to FIG. 3B, once the mounting shaft 20b is in a lower position, the end 84 of the wedge 80 may be inserted into the slot 50 of the mounting shaft 20b by virtue of the force applied on the wedge 80 by the wedge spring 82. The generally sloping upper section of the end 84 may abut an upper wall of the slot 50, thereby applying an upward force on the mounting shaft 20b. As the end 84 enters deeper into the slot 50, the upward force on the mounting shaft 20b may be maintained due to the sloping design of the end 84 upper section. In the lower position, the pin 48 may be substantially inserted within the notch 74 of the catch member 30b. By virtue of the insertion of the wedge end 84 into the slot 50 and the upward force maintained thereon, substantially any tolerance between the pin 48 and the notch 74 may be taken up. Therefore, a substantially tight fit between the heat generating component 12 and the heat dissipating device 22 may be obtained.

In order to remove the cooling system 10, the slide knobs 34a and 34b are moved in the directions generally indicated by arrows 86 (FIG. 1). The movement of the slide knobs 34a and 34b in the indicated directions generally causes the wedge ends 84 to substantially disengage from the slots 50. The shaft assemblies 20b and 20d may then be turned to disengage the pin 48 from the notches 74 and the cooling system 10 may then be disengaged from the heat generating component 12.

It should be understood that the cooling assembly 10 may include additional components and that some of the above-described components may be removed and/or modified without departing from the scope and spirit of the invention. For example, the locking wedges 80 and its related components may be removed and/or modified without substantially altering the effectiveness of the cooling assembly 10.

Figure 4:
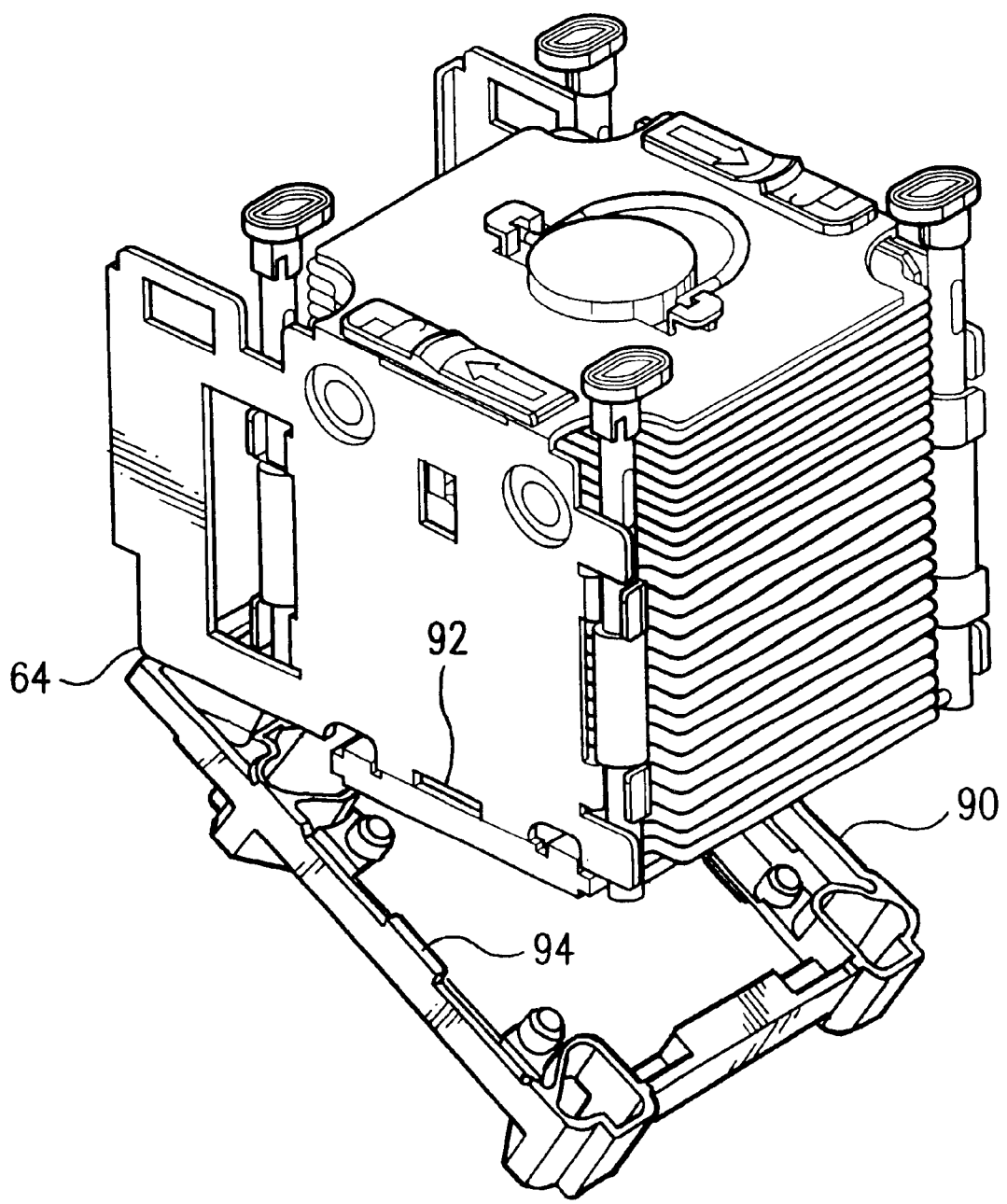
FIG. 4 is a perspective view of the shroud assembly illustrated in FIG. 2 illustrating a manner of attaching a bottom frame to the shroud assembly.

Illustrated in FIG. 4 is a manner in which a bottom frame 90 may be attached to the shroud assembly 16. The shroud assembly 16 is shown as having at least one female connecting element 92 for receiving at least one male connecting element 94 of the bottom frame 90. The bottom frame 90 includes a plurality of holes (not shown) for receiving a plurality of hinge members 64 protruding downwardly from each of the lateral extensions 62a and 62b of the side walls 60a and 60b. The bottom frame 90 may be hingedly attached to the frame hinge members 64 to allow the bottom frame 90 to be rotated and attached to the shroud assembly 16. Once the bottom frame 90 is substantially aligned with the shroud assembly 16, each of the at least one male connecting element 94 may be inserted into one of each female connecting element 92 located on the shroud assembly 16. After the bottom frame 90 has been connected to the shroud assembly 16, the bottom frame 90 supports the bottom of the heat dissipating device 22 and also provides a base for supporting the fan assembly 24.

Figure 5:
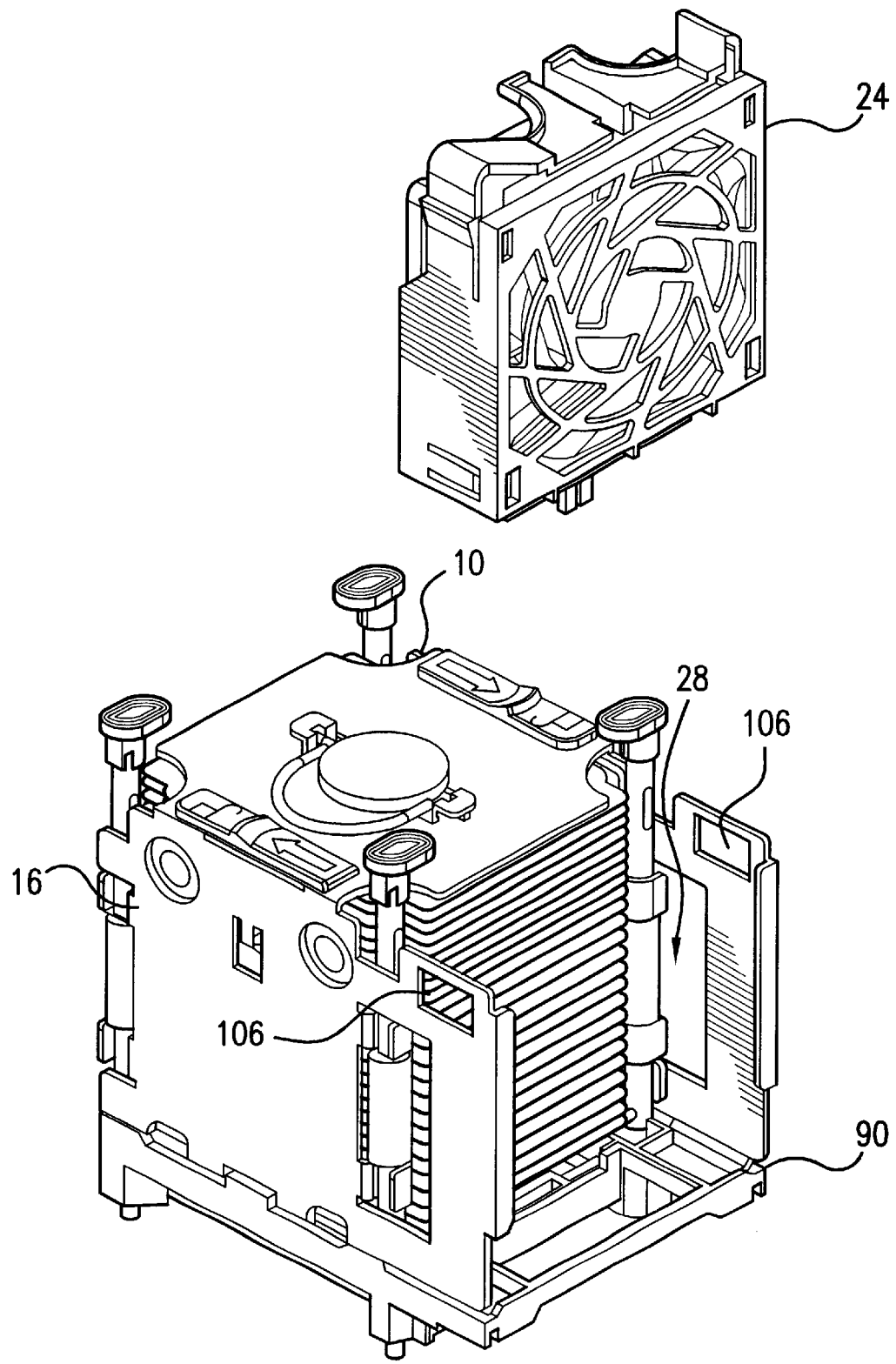
FIG. 5 is a perspective view, similar to that illustrated in FIG. 1, showing a manner in which a fan assembly may be inserted within a shroud assembly in accordance with an embodiment of the present invention.

In FIG. 5, the fan assembly 24 is illustrated as being detached with respect to the shroud assembly 16. The second section 28 of the shroud assembly 16 provides an area along with the bottom frame 90 to receive the fan assembly 24. The fan assembly 24 may be inserted into the second section 28 by dropping it in a substantially vertical manner with respect to the shroud assembly 16.

Figure 6:
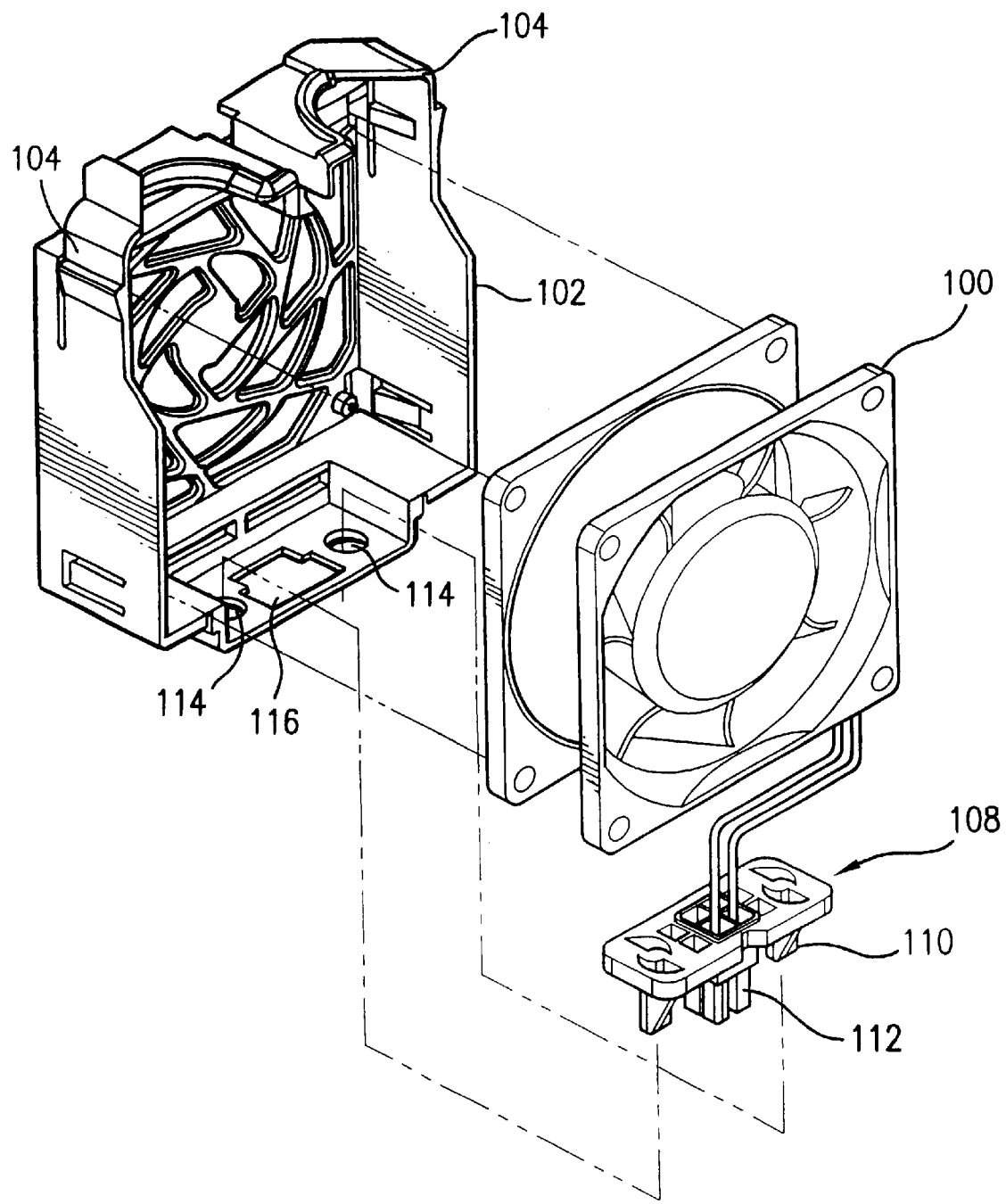
FIG. 6 is an exploded perspective view illustrating a manner in which a fan assembly may be attached to a fan housing in accordance with an embodiment of the present invention.

With reference to FIG. 6, the fan assembly 24 is illustrated as comprising a fan device 100 that is insertable within a fan housing 102. The fan housing 102 includes a pair of movable tabs 104 which are resiliently attached the fan housing 102 and are configured for insertion into a pair of openings 106 provided on the lateral extensions 62a and 62b of the shroud assembly 16 (FIG. 5). The fan housing 102 may be fabricated from any suitable flame retardant plastic material, such as, polycarbonate-ABS blend, or the like.

The fan device 100 may be any suitable fan device which may be inserted into the fan housing 102 and provides a sufficient amount of air flow through the heat dissipating device 22 to adequately cool the heat generating component 12. One example of a suitable fan device is a tube axial fan manufactured by DELTA ELECTRONICS, Inc., of Taiwan, R.O.C. The fan device 100 may possess a floating connector assembly 108 (e.g., a connector manufactured by MOLEX, Inc.) having a plurality of tab members 110 and a connector member 112. The connector assembly 108 provides a means for electricity to flow into the fan device 100. Accordingly, the fan housing 102 includes a plurality of slots 114 for receiving the tab members 110 to thus allow for the floating connector assembly 108 to be relatively securely fastened to the fan housing 102. The fan housing 102 also possesses a connector opening 116.

By way of the movable tabs 104 and the openings 106, the fan assembly 24 may be relatively securely held within the shroud assembly 16 without requiring that any tools be used in the process. Additionally, this configuration enables the fan assembly 24 to also be relatively easily removed from shroud assembly 16 without requiring the need for tools. Furthermore, because the fan assembly 24 is insertable into the shroud assembly 16 through an upper opening thereof and does not require the use of any tools, the fan assembly 24 may be inserted into and removed from the shroud assembly 16 without requiring that the cooling assembly 10 be separated from the substrate 14. As a consequence, for example, if the fan device 100 becomes damaged or otherwise is in need of repair or replacement, the fan assembly 24 may be removed in a relatively simple manner (e.g., without requiring tools) and replaced in an equally simple manner.

Figure 7:
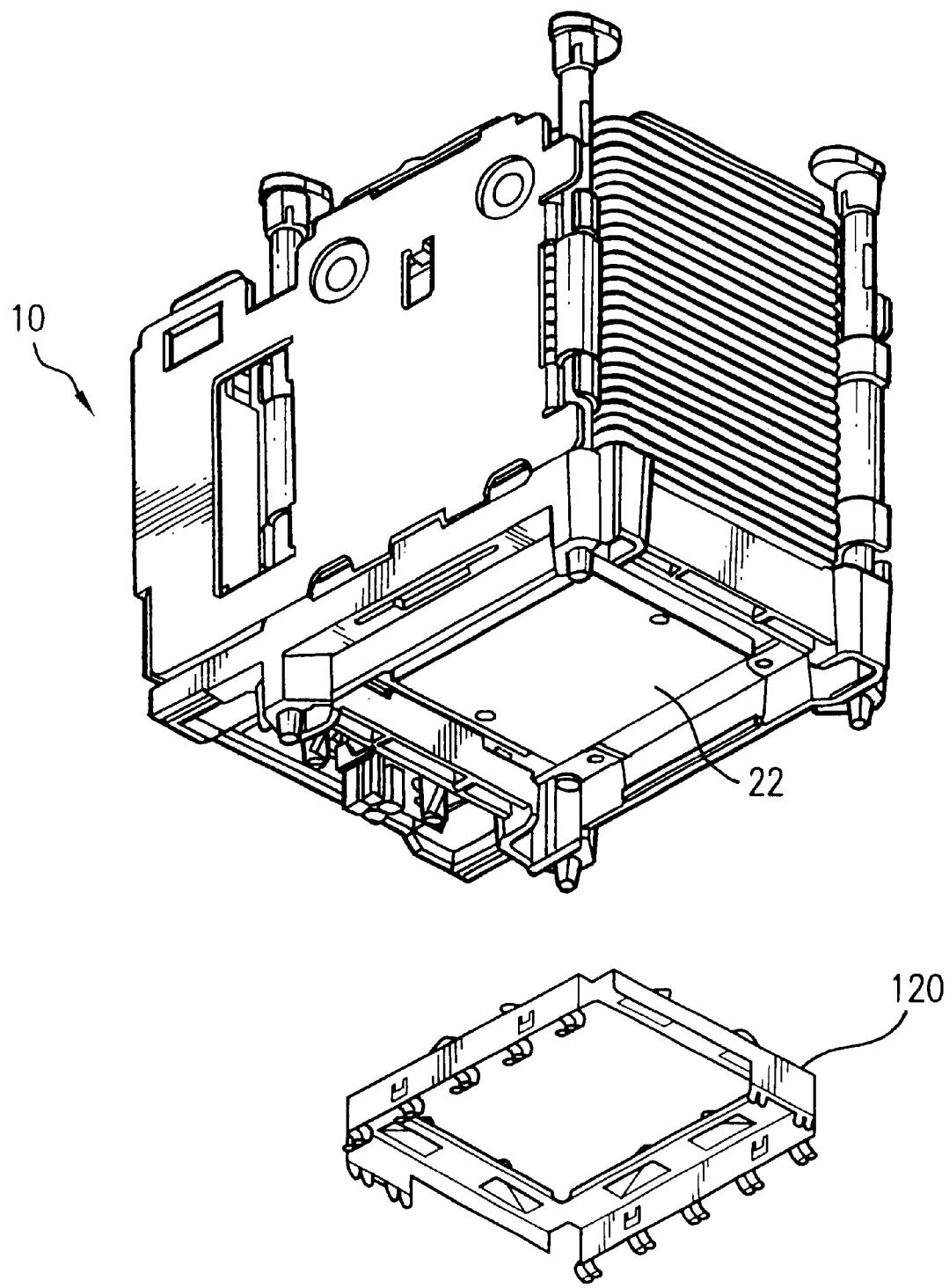
FIG. 7 is a bottom exploded perspective view of the cooling assembly shown in FIG. 1 illustrating a manner in which an electromagnetic shield is attached to the cooling assembly.

FIG. 7 is a bottom elevational view of the cooling assembly 10 of the present invention illustrating an electromagnetic interference ("EMI") shield 120. The EMI shield 120 generally provides a faraday shield around the heat generating component 12 to thus substantially prevent the emissions caused by the heat generating component 12 from interfering with other devices in the vicinity of the electronic device. EMI shields are widely known and readily available to those skilled in the art. Additionally, it should be understood that thermal transfer material may be positioned between a bottom surface of the heat dissipating device 22 and a top surface of the heat generating component 12. Exemplary thermal transfer material may include, thermal grease, thermal pads, and the like.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A cooling assembly for dissipating heat produced in a heat generating component of an electronic system, said assembly comprising:
   a shroud assembly;
   a heat dissipating device removably housed within said shroud assembly;
   a fan assembly removably housed within said shroud assembly;
   a plurality of mounting assemblies slidably attached to said shroud assembly and configured to removably secure said cooling assembly in thermal connection with said heat generating component; and
   at least one wedge attached to the shroud assembly and removably insertable into a slot contained in at least one of the plurality of mounting assemblies.

2. The cooling assembly of claim 1, wherein said at least one wedge is slidably attached to said shroud assembly, said at least one wedge being configured to engage said at least one of said plurality of mounting assemblies when said cooling assembly is in thermal connection with said heat generating component.

3. The cooling assembly of claim 2, further comprising:
   at least one slide knob located on an outer surface of said shroud assembly, said at least one slide knob being connected to said at least one said wedge, wherein movement of said at least one slide knob is operable to move said at least one wedge.

4. The cooling assembly of claim 2, wherein said at least one wedge is biased in a direction generally toward one of said plurality of mounting assemblies, said one of said plurality of mounting assemblies including a slot to receive an end of said at least one wedge, wherein said end is configured to be inserted into said slot by operation of said bias when said cooling assembly is secured to said electronic system.

5. The cooling assembly of claim 1, wherein said plurality of mounting assemblies comprises a plurality of rods including a pad on one end of each said rod and a latch on another end of each said rod, and a spring located on each of said rods to bias said rods in a direction with respect to said shroud assembly.

6. The cooling assembly of claim 5, wherein said latch is configured to mate with a catch member positioned on a substrate of said electronic system.

7. The cooling assembly of claim 1, wherein said fan assembly comprises a fan device housing and a fan device, wherein said fan device is configured to snap into said fan device housing.

8. The cooling assembly of claim 7, wherein said heat dissipating device and said fan assembly are configured for installation within said shroud assembly without use of hardware or tools.

9. The cooling assembly according to claim 1, further comprising:

a handle attached to the shroud assembly.

10. A system for cooling a heat generating component, said cooling system comprising:

heat dissipating means for cooling said heat generating component;

connecting means for detachably connecting said heat dissipating means to a substrate supporting said heat generating component, wherein said connecting means includes a plurality of mounting shaft assemblies slidable on the heat dissipating means at least one of said plurality of mounting shaft assemblies including a slot; and locking means for engaging the slot of the at least one of the plurality of mounting shaft assemblies to generally lock the at least one of the plurality of mounting shaft assemblies in a position with respect to the heat generating component.

11. The system according to claim 10, wherein said heat dissipating means comprises a shroud assembly housing a heat dissipating device and a fan assembly.

12. The system according to claim 10, wherein said connecting means includes at least one spring such that said heat dissipating means may be removably secured in thermal connection with said heat generating component with a predetermined pressure.

13. The system according to claim 10, wherein said locking means comprises at least one wedge biased in a direction toward said at least one mounting shaft assembly.

14. The system according to claim 13, further comprising:

means for releasing said at least one wedge from said slot.

15. The system according to claim 9, wherein said plurality of mounting shaft assemblies comprises a rod, a pad positioned on one end of said rod, and a latch member positioned on another end of said rod.

16. The system according to claim 15, wherein said connecting means further comprises a plurality of hook members configured to be attached to said substrate, said plurality of hook members being shaped to mate with a respective latch member of said mounting shaft assemblies.

17. A method for cooling a heat generating component of an electronic system, said method comprising:

inserting a heat dissipating device within a first section of a shroud assembly;

supporting said heat dissipating device within said first section of said shroud assembly with a bottom frame of said shroud assembly;

inserting a fan assembly into a second section of said shroud assembly;

positioning said shroud assembly over said heat generating component such that a bottom surface of said heat dissipating device is positioned substantially directly over said heat generating component;

maneuvering a plurality of movable mounting assemblies on the shroud assembly into engagement with a plurality of catch members of the heat generating component to position the heat dissipating device in thermal attachment with said heat generating component; and inserting a wedge of the shroud assembly into one of the plurality of mounting assemblies to substantially prevent the one of the plurality of mounting assemblies from rotating.

18. The method for cooling a heat generating component of claim 17, wherein said fan assembly comprises a fan device and a fan housing, wherein said fan device is snapped into said fan housing prior to said fan assembly being inserted into said second section.

19. The method for cooling a heat generating component of claim 17, wherein said plurality of mounting assemblies comprises rods, said rods having a pin and a pad, and wherein said plurality of catch members includes slots, said maneuvering step further comprising:

pushing respective pads provided on said respective rods to generally align said pins with respective slots of the catch members; and turning respective pads to cause said respective pins to be inserted into respective ones of said slots.

20. The method for cooling a heat generating component of claim 19, further comprising:

inserting an end of the wedge into a slot of one of said rods upon insertion of said respective pins into respective slots of the plurality of catch members, wherein said wedge substantially ensures contact between said heat dissipating device and said heat generating component.

* * * * *